United States Patent

Shie

[11] Patent Number: 6,013,935
[45] Date of Patent: Jan. 11, 2000

[54] SOLID-STATE SWITCH DRIVEN BY THERMOVOLTAIC GENERATOR

[76] Inventor: Jin-Shown Shie, 1F, No. 1017, Ta-Hsueh Rd., Hsinchu, Taiwan

[21] Appl. No.: 09/010,980

[22] Filed: Jan. 22, 1998

[30] Foreign Application Priority Data

Oct. 8, 1997 [TW] Taiwan ................................. 86114795

[51] Int. Cl.$^7$ .............................. H01L 23/58; H01L 31/58
[52] U.S. Cl. ......................... 257/469; 257/531; 257/532; 257/533; 257/536; 257/419; 257/467
[58] Field of Search .................................... 257/531, 532, 257/533, 536, 419, 467, 469

[56] References Cited

U.S. PATENT DOCUMENTS 5,100,479  3/1992  Wise et al. ................................. 437/3

*Primary Examiner*—Brian Dutton
*Assistant Examiner*—Hung Van Duong
*Attorney, Agent, or Firm*—Pillsbury Madison & Sutro

[57] ABSTRACT

This invention relates to a high-transimpedance solid-state switch manufactured by micromachining technology. A thermopile is formed by a thin-film structure capable of producing sufficient thermoelectrical voltage to drive a MOS transistor on and off, functioning like a switch. The driving thermoelectric voltage is generated by Joule's heat released by a thin-film heater disposed nearby a thermopile hot junction to generate a substantial temperature difference related to its cold junction. These elements can be monolithically integrated, wherein the heater and hot junctions are disposed on a thermal pad formed by micromachining having high thermal isolation. This invention has the following advantages: 1) the input and output ends are thermally coupled, thus are electrically isolated (very high transimpedance), therefore a small input power is able to control the MOS device having high output voltage and power; 2) the solid-state switch is a micromachined monolithic structure which is batch-producible, rather than the single-unit production for traditional mechanical switch; 3) when the present switch is ON/OFF, it is unnecessary to employ the charge leakage circuit essential for the current "photoelectric-coupling MOS solid state switch", therefore the chip area is reducible; 4) the input of the switch for driving the heater can be designed to be high or low, AC or DC voltage, according to the necessity; 5) package of this invention may utilize the standard "dual-in-line" structure, which is simpler and less costly compared with the photo-coupled switch whose package is 3-dimensional.

14 Claims, 10 Drawing Sheets

SOLID-STATE SWITCH DRIVEN BY THERMOVOLTAIC GENERATOR

BACKGROUND OF THE INVENTION

Semiconductor-type solid state switches are used extensively in various industrial applications today. Such solid-state elements have the advantages such as no mechanical contact, therefore no sparkling and fast triggering, and when such elements are used for switching on/off the high-powered system, it is very safe and durable. Now a day, they are indispensable for modern industrial electrical power control. Among these, the solid-state switch devices which are used most extensively are silicon-controlled recifier (SCR) and TRIAC that is obtained by connecting two SCRs in anti-parallel status.

Using a SCR for triggering large current has the following disadvantages: (1) the transimpedance between the input and output terminals of a SCR is small, therefore the two terminals are not isolated from each other; if a high voltage appears at the output end, it is likely to have a chance causing breakdown at the input circuit; (2) any SCR element has the characteristics of latch-up after triggering, once a SCR is triggered to be in conducting state, it will not be terminated until the potential difference between anode and cathode is zeroed, or unless an inverse current is injected into the gate. These are different from the traditional mechanical switch having high-transimpedance characteristic, i.e. the electrical isolation between the input and output ends is complete, and latch-up property is naturally absent. From the above mentioned, there are intrinsic disadvantages for the use of an SCR.

To achieve the functions of a traditional mechanical switch without losing the advantages of non-contact and no sparkling, there is another new type of solid-state switching device used increasingly in recent years. The electricity-driving of the device is achieved by high voltage, high power enhancement-mode MOS transistors which are normally off. Since a MOS transistor is a bilateral device with very high input impedance to its input gate, it behaves similarly to a conventional mechanical switch. When the device is to be driven to turn on, we need only apply a threshold voltage to the gate. For a power MOS transistor the threshold voltage is approximately 3 volt, and since the MOS transistor has a very large input impedance, the required current and power for driving this element are both small. The MOS transistor can be driven to turn on by charging the gate capacitor thereof, whose capacitance is very small; when the external driving voltage is removed, the gate stray charge decreases gradually due to through certain leakage loop and until its voltage drops down below the threshold voltage then the MOS transistor becomes off. Besides, since the MOS transistor is a bilateral element, it can be used for driving the alternating power under appropriate design. In this way, it is like the mechanical switch.

To reach a triggered conduction of the power MOS transistor, there must be a circuit generating a sufficient potential over the threshold value, which is applied between the gate and source. Furthermore, there must be very high electrical isolation between the input terminal and the output terminal such that the above-mentioned disadvantages of the SCR can be avoided. At present, it is common to utilize "photovoltaic effect" of the diode photo cell, as shown in FIG. 1. In FIG. 1, there are a plurality of silicon photodiodes in series connection before the gate G of the power MOS transistor Q, the series-connected diodes are illuminated by a light emitting diode LED, a photo-voltage is thus generated. In general, the photo-voltage generated by a silicon diode is approximately 0.3~0.6V, so the structure of ten series-connected silicon diodes can generate a voltage higher than the threshold voltage (about 3V) of the power MOS transistor, which can turn on the power MOS transistor. The "photovoltaic generator" (PVG) switch of such photoelectric coupling type is similar to those of the photo coupler or opto isolator used in communication electronics. Since there is no circuit connection between the light emitting diode and silicon diodes, the PVG switch has very large transimpedance. This type of photovoltaic generator switch can drive an output load having very high voltage and current at the output end of the MOS transistor using a small lighting power at light emitting diode end, which does not result in electrical breakdown at the input. It is a new and excellent solid-state power electronic switch at present, which can be referred to in product catalogs of many corporations.

However, when this type of MOS power switch driven by the "photovoltaic generator" is at the beginning of turning off, i.e. when the light of the LED is turned off, there is parasitic charge stored at the gate capacitor $C_G$ (~120 pf) of the power MOS, which must be leaked away so that the power MOS can be turned off. However, since then the diode is under high impedance of negative bias condition, the charge is not easy to leak away. Therefore, the MOS transistor can not responds and becomes off instantaneously. As an electricity switch, such delay at the turning off is very undesirable, if it is too long to harm the switching operation. To overcome the disadvantage, a circuit which provides discharging path is indispensable between the gate and the output of the photocell for the present "photovoltaic generator MOS switch" (PVG switch), as illustrated by the block S in FIG. 2. The existence of such circuit results in not only an increase of total cost due to chip area being increased and process being more complex, but also an increase demand of total photovoltaic power to be generated, which means the number of light emitting diodes has to be increased or the chip area of the photocells has to be enlarged to replenish, this again leads to the increase in cost. Furthermore, it becomes more difficult to make the light of the LED uniformly irradiating on the surfaces of the photo cells.

Besides, as shown in FIG. 3A, concerning the package structure of the photovoltaic generator solid-state switch, since the light emitting diode and the photo cell have to face to each other such that direct optical coupling is possible, the package structure is more complicated than the planar package structure of ordinary IC, as shown in FIG. 3B, the cost of package is thus considerably higher. Besides, the package epoxy between the two elements must be transparent for the light of the LED wavelength, otherwise photo coupling is hardly performed. For the present epoxy material used for IC package, the light source used must be an infrared LED which emits light with wavelength around 900 nm able to transmit through the epoxy material for the coupling. The silicon photo cell, which is quite cheap, has higher photoelectric transformation efficiency in the spectrum section.

Using single-chip silicon photo cell has the following disadvantages. Since the silicon photodiodes used by the photovoltaic generator switch have to be connected in series for generating sufficient photovoltaic voltage to drive the power MOS transistor, there is difficulty when the elements are formed on one silicon chip, as explained in the following: (1) There must be very high electrical isolation between adjacent diodes such that series connection takes effect, otherwise leakage will be brought about and induced voltage and current decrease; (2) The absorption length of single crystal silicon for the wavelength of 900 nm is quite large, therefore the photodiodes on the silicon chip must have deep junctions such that photoelectric conversion efficiency can be raised to a reasonable level, which leads to even deeper isolation between adjacent elements. This deep isolation is hard to implement on ordinary silicon chips. To achieve the object, silicon-on-insulator (SOI) waver is utilized in many present products such that isolation between adjacent elements can be accomplished, as the structure shown in FIG. 4. However, the SOI wafer is more expensive as compared with ordinary single crystal silicon wafer and the manufacturing process of the SOI chip is also more complicated. In addition, the thickness of silicon on the isolation layer cannot be increased too much, otherwise V-groove will be too deep to be made flat, which leads to the decrease of photo absorption efficiency.

In short, although the power MOS solid-state switch device of photovoltaic generator has been put into practice at present, however, as described in the above, the disadvantages related with the material, manufacture, package structure of the elements altogether make such solid-state switch cost high or have unnegligible disadvantages.

SUMMARY OF THE INVENTION

It is therefore an primary object of the present invention to provide a solid-state switch which is based on different physical principle and has the following advantages: chip area being small, standard IC manufacturing process, packaging being easy and cost being low.

The solid-state switch in accordance with the present invention is based on the physical effect of thermoelectric transducing, in which the characteristic of high transimpedance is achieved by thermal coupling instead of optical coupling of photoelectric effect.

The solid-state switch in accordance with the present invention includes: a silicon substrate, a thermal pad, a thin-film heating resistor and thermopile. The thermal pad is formed by fabricating a suspended membrane on a partial region of the silicon substrate by micromachining technology. The thin-film heating resistor, fabricated on the thermal pad, is used as the input end of the solid-state switch. The thermopile, made of a semiconductor membrane, is composed of a plurality of series-connected thermocouples, wherein the hot junctions of the thermocouples are disposed inside the thermal pad region and near to the thin-film heating resistor, the cold junctions of the thermocouples are disposed outside the thermal pad region and far from the thermal pad. The output end of the thermopile is used as the output end of the solid-state switch.

As an input voltage is applied at the input end of the heating resistor such that Joule's heat is generated, the heat flows from the heating resistor to the substrate region, which induces a proper temperature difference between the hot junctions and the cold junctions of the thermopile by virtue of non-uniform heat distribution. A thermoelectric potential is thus generated at the output end of the thermopile which turns on the MOS transistor connected to the output end of the thermopile. On the other hand, as the input voltage applied at the input end of the heating resistor is removed, it turns out that the hot junctions and cold junctions have identical temperature by virtue of thermal equilibrium, the thermoelectric potential appearing at the output end of the thermopile becomes vanished, which turns off the MOS transistor.

BRIEF DESCRIPTION OF THE DRAWING

Other objects, features, and advantages of the present invention will become apparent by way of the following detailed description of the preferred but non-limiting embodiments. The description is made with reference to the accompanied drawings in which:

FIGS. 8A and 8B show two packages of a solid-state switch driven by thermovoltaic generator having suspended thermal pad, wherein FIGS. 8A and 8B are to metal-can package and DIP package, respectively;

DETAILED DESCRIPTION OF THE PREFERRED EMBODIMENTS

Figure 5D:
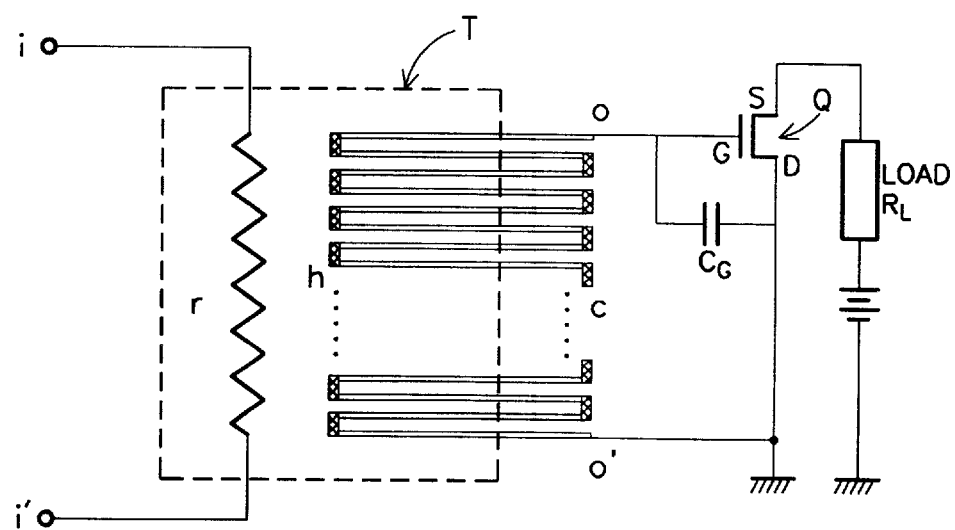
FIG. 5A~FIG. 5D together show the structure of the solid-state switch driven by thermovoltaic generator according to the present invention.
Figure 5A:
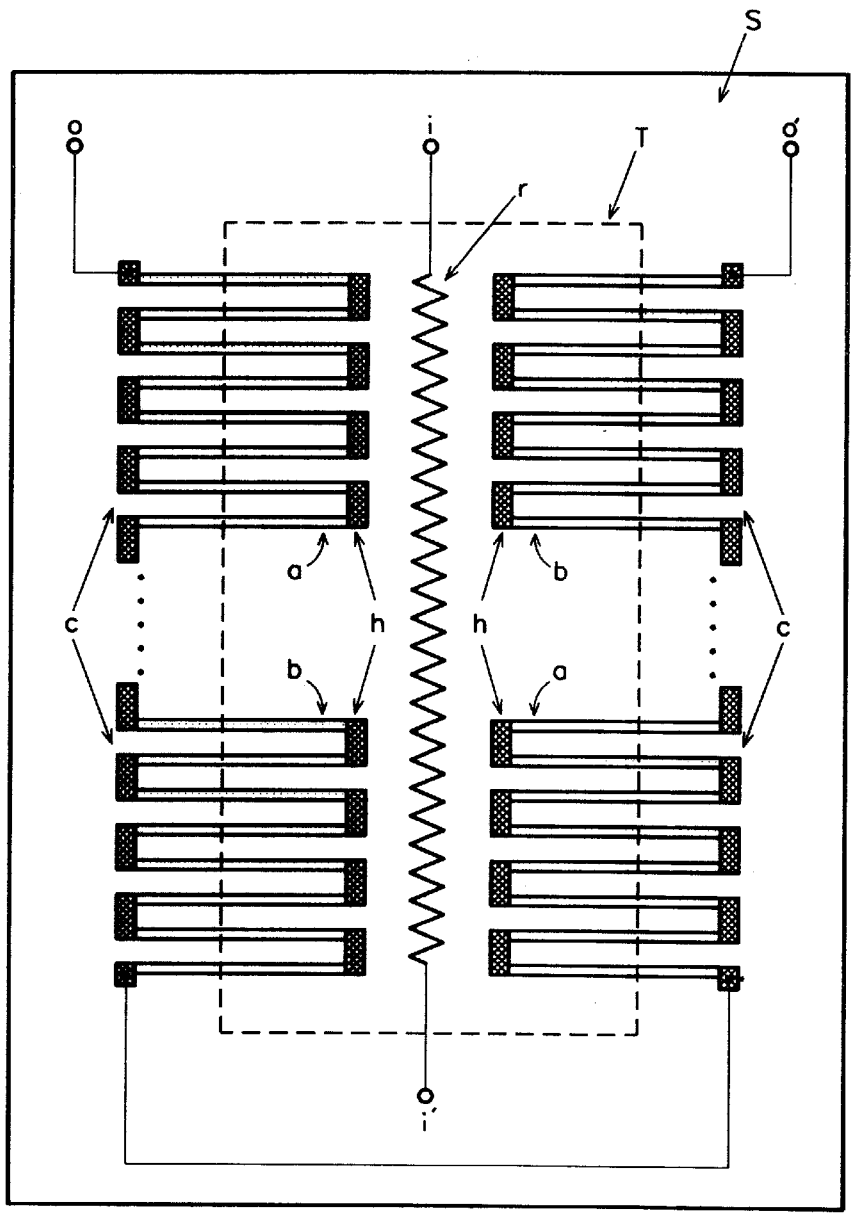
Figure 5B:
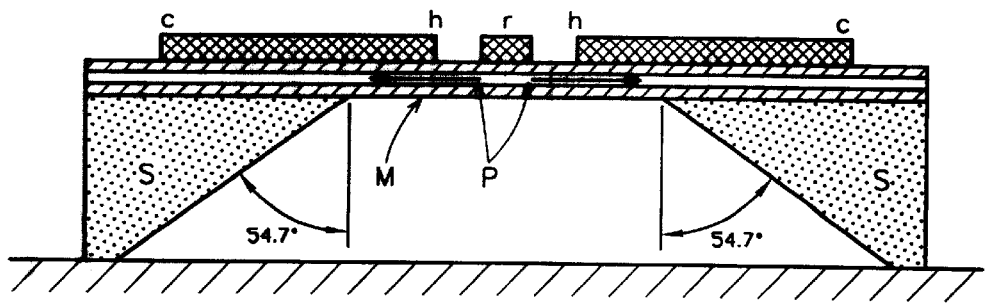
Figure 5C:
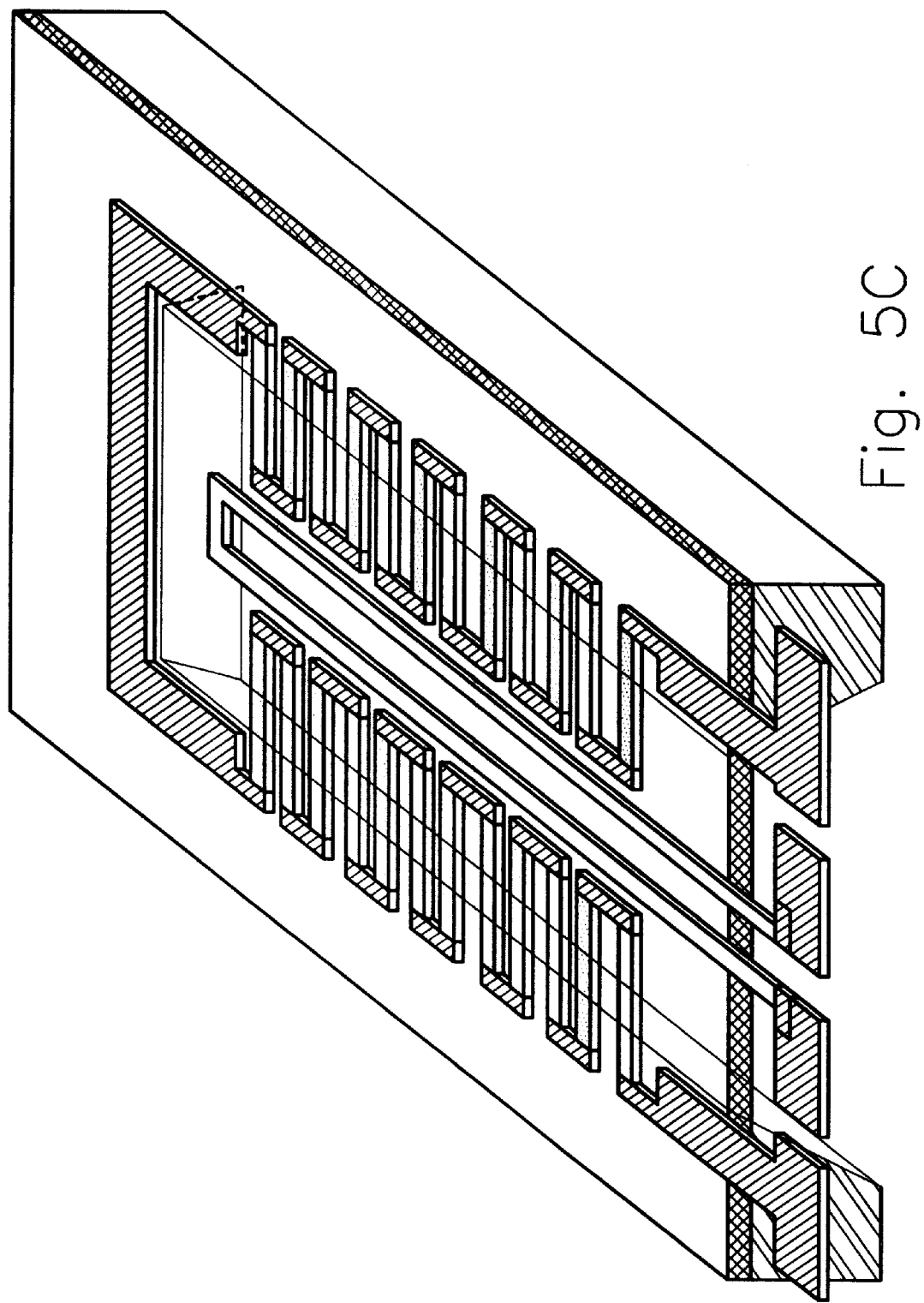

FIG. 5A~FIG. 5D together show the structure of the solid-state switch driven by thermovoltaic generator according to the present invention, wherein FIGS. 5A, 5B, 5C are top view, side view and perspective view, respectively, of the thermovoltaic generator according to the present invention; FIG. 5D is a schematic diagram illustrating how the MOS transistor Q is driven by thermovoltaic generator. Refer to FIG. 5A, wherein the element r represents a thin-film heating resistor whose two ends ii' are the input ends of the solid-state switch in accordance with the present invention. As current flows into the input end, Joule's heat is generated and a local temperature rise occurs in the vicinity. This electric heating element is located inside a T zone (FIG. 5A) which corresponds with the local thermal pad M on the silicon substrate S (FIG. 5B). The thermal pad M has the effect of enhancing temperature rise. In FIG. 5, the thermal pad M is formed by utilizing back-side anisotropic etching of bulk micromachining technology, which has the structure of suspended membrane M (FIG. 5B), as will be described in more detail. When electric heat power P on the thermal pad M flows to the substrate S (FIG. 6B) whose temperature is lower, since there exists a substantial thermal resistance intermediately, a temperature difference is generated between the thermal pad M and the substrate S. In addition, in FIG. 5A, there is a thermopile formed by a plurality of series-connected thin-film thermocouples, each of them consists of two materials a and b. The hot junctions h of the thermopile are contiguous to the aforementioned heating resistor r and disposed on the thermal pad zone T, therefore its temperature is very near that of heating resistor r. On the other hand, the cold junctions c of the thermopile are disposed on the non-suspended substrate S, which is far from the thermal pad zone T. Since the cold junctions c are immediately adjacent to the silicon substrate S, heat dissipation is very fast. Therefore, the temperature of the cold junctions is basically the same as that of the substrate S, the room temperature. According to the structure, one can understand that the heat distribution on the substrate S is non-uniform after electric power is input to ii' terminals, a predetermined temperature difference is thus generated between each pair of cold junction and hot junction. These temperature differences together result in an accumulated thermoelectric voltage between the outputs oo' of the thermopile. As shown in FIG. 5D, the potential is applied on the gate and drain (ground) of the power MOS transistor Q, which can turn on the transistor Q, like the solid-state switch driven by photovoltaic generator as stated in the above. However, it is to be noted that the two are completely different concerning the physical basis and engineering technology of generating this potential difference, one uses light as the coupling media, the other uses heat as the media. When the input electric power is removed, the temperature of the thermal pad begins to decrease and soon becomes the same as that of the cold junctions, room temperature. In the meantime, the thermoelectric voltage disappears simultaneously and the MOS transistor Q which is normally off returns to "off" state. Namely, the actuating energy required for driving the MOS transistor to be ON or OFF is generated by way of thermal coupling of Joule's heating-thermoelectricity effects. As a solid-state electronic power switch, it has the following advantages:

(1) Since the heating resistor r and thermopile are isolated from each other by good electrical isolation material such as silicon dioxide or silicon nitride, there is no direct electrical coupling or electrical connection between them. Therefore, the solid-state switch in accordance with the present invention has extremely high transimpedance, which is the same as the solid-state switch driven by photovoltaic generator;

(2) The thermopile is a thin-film element manufactured by resistive material, although the series-connection resistance may reach up to 100 KΩ in certain practical application, it is still small as compared with the reverse impedance of a photo diode (generally up to more than $10^{12}$). If the gate capacitor $C_G$ of a typical high power MOS is conservatively estimated to be at most 150 pF, the charge/discharge time constant of the RC circuit formed does not exceed the range of tens of microseconds. Consequently, the charge on the gate capacitor of the solid-state switch in accordance with the present invention discharges very fast.

In view of this, one can understand the following facts: (1) leakage circuit, what is indispensable in the solid-state switch driven by photovoltaic generator, is no more necessary in the solid-state switch in accordance with the present invention, therefore both the power for driving the switch and the necessary chip area can be reduced; (2) the manufacturing process, which can be implemented completely with standard silicon semiconductor technology, is simpler. In conclusion, the solid-state switch in accordance with the present invention provides improvements over the switch driven by photovoltaic generator on both performance and cost.

In practice, the on/off speed of the solid-state switch in accordance with the present invention is dominated by the thermal time constant of temperature rise/fall of that switch. This thermal time constant is determined by the product H*Z, wherein H represents the heat capacity of the thermal pad on the switch and Z represents the thermal resistance of the heat path flowing from the thermal pad to the substrate. The thermal pad can be formed with very small size, in the range of several millimeters, by IC manufacturing technology, whose heat capacity is very small. Under appropriate design of the thermal pad structure, the thermal time constant can be in the range of 0.1~1 millisecond or smaller. Therefore, the solid-state switch in accordance with the present invention has an on/off speed faster than that of conventional mechanical switches (about 1.25 millisecond). Besides, the speed is not second to that of the switch driven by photovoltaic generator, which implies that the present invention is provided with high practical value.

As described, since the input resistance of the MOS transistor is very large, the current and power required to turn on the MOS transistor are both quite small. Concerning the thermoelectric voltage which the thermopile needs to generate for driving the power MOS transistor, it can be formulated as follows:

$$emf = \alpha_{ab} * N * \Delta T = m * V_{th} \quad (1)$$

wherein emf is the thermoelectric potential generated by the thermopile;

$\alpha_{ab}$ is defined as the difference of Seebeck coefficient (or thermoelectric power) between two materials $a(\alpha_a)$ and b ($\alpha_b$) which together constitute a thermocouple;

N is the pair of thermocouples of the thermopile;

$\Delta T$ is the average temperature difference between the cold and hot junctions;

$V_{th}$ is the threshold voltage of the enhancement MOS transistor;

m is a safety coefficient which should be slightly larger than 1.

According to Fourier's law, the temperature rise relative to the substrate temperature or the environment temperature is expressed as follows:

$$\Delta T = P \cdot R_T = i^2 \cdot r R_T = i \cdot V \cdot R_T \quad (2)$$

wherein r represents the resistance of Joule's heating resistor at the input end;

P, i and V represent electric power, current and voltage at the input end, respectively;

$R_T$ represents the thermal resistance (° C./W) from the heating resistor to the substrate.

By equations (1) & (2), the required number of thermocouples is:

$$N = \frac{m \cdot V_{th}}{\alpha_{ab} \cdot \Delta T} = \frac{m \cdot V_{th}}{\alpha_{ab} \cdot i^2 \cdot r R_T} = \frac{m \cdot V_{th}}{\alpha_{ab} \cdot i \cdot V \cdot R_T} \quad (3)$$

The equation can be illustrated by the following embodiment.

Assume the solid-state switch in accordance with the present invention has the following parameters:

$R_T = 10^{3}$ ° C./W ; i=5 mA;

V=10 Volt; $\alpha_{ab}$=200 μV/° C. (for the case of Bi—Sb metal thermocouple);

$V_{th}$=3 Volt; m=1.5;

then the required pair of thermocouples is:

$$N = \frac{1.5 \times 3}{200 \times 10^{-6} \times 5 \times 10^{-3} \times 10 \times 10^3} = 450 \text{ pairs}$$

therefore, a thermopile consisting of 450 series-connected thermocouples is necessary. If the thermocouple design rule has a line length of 300 μm, spacing and line width both of 10 μm, then each thermocouple has a pitch of 40 μm. Therefore the required active area of the element is approximately:

0.3×0.04×450 mm²=5.4 mm.

If the bonding pad needed for the heating resistor and the border area of 0.4 mm² (estimated with a width of 400 μm and a length of 1000 μm) is taken into consideration, then the solid-state switch in accordance with the present invention, not including the MOS power transistor, has an area not exceeding 6 mm². The area is smaller than that of the switch driven by photovoltaic generator as described in the above. Furthermore, monolithic package structure for the switch in accordance with the present invention can be implemented by ordinary standard CMOS IC process of silicon technology, whose cost is less as compared to the package implemented by SOI process for the switch driven by photovoltaic generator.

In the above embodiment, the temperature rise of the element is:

$$\Delta T = P \cdot R_T = (5 \times 10^{-3} \times 10) \times 10^3 = 50(^\circ \text{ C.}).$$

The temperature rise plus the substrate temperature (room temperature) is the temperature of the thermal pad, which is below 100° C. and does not destroy thermal stability of the elements and package material. In fact, the value of the thermal resistance, $10^{3\circ}$ C./W, is under estimated, an order higher can be achieved by careful design of the thermal pad structure without difficulty. Therefore lower temperature rise can be achieved in practice.

If the thermocouple consisting of p-n junction is fabricated using polysilicon as material, its Seebeck coefficient $\alpha_{ab}$ can reach about 1~2 mV/° C., which is five times that of Bi—Sb thermocouple. If all other conditions are kept the same as in the aforementioned embodiment, the number N of the thermocouples can be reduced to below 90, which makes the element thus formed have size below 2 mm². Optionally, the number of the thermocouples is kept to be 450, the required temperature rise of the thermal pad is merely 10° C., and the input current can also be reduced to order of 1 mA. The current is much smaller than the current required under ordinary situation for the switch driven by photovoltaic generator which utilizes LED (20 mA).

With regard to manufacture of the solid-state switch in accordance with the present invention, the heating thin-film resistor may be made of any refractory metal such as Ti, W, or aluminum material with low resistance, or polysilicon material with high resistance which also forms the thermopile device simultaneously in process. All these materials are commonly used for manufacturing various semiconductor microelectronic elements at present, thus they are completely compatible with standard IC-process. Concerning the thermopile, aparting from the "semi-metal" such as Bi, Te and Sb, which are used as the material of conventional 'thermopile sensitive element", polysilicon is another option which can be used to form thermopile. Specifically, polysilicon can be used to form p-n junction semiconductor which constitutes a thermocouple. The polysilicon thermocouple besides has the advantage that the sensitivity of thermoelectric power up to 1 mV/° C., it is completely compatible with standard IC manufacturing process. These technologies are commonly known and in public use, for instance, as described in detail in the book "Silicon Sensors" written by S. Middelhoek and S. A. Audet, in which the method to fabricate heat radiation micro-sensor is explained. Therefore, there is no practical difficulty in manufacturing the solid-state switch in accordance with the present invention.

Figure 1:
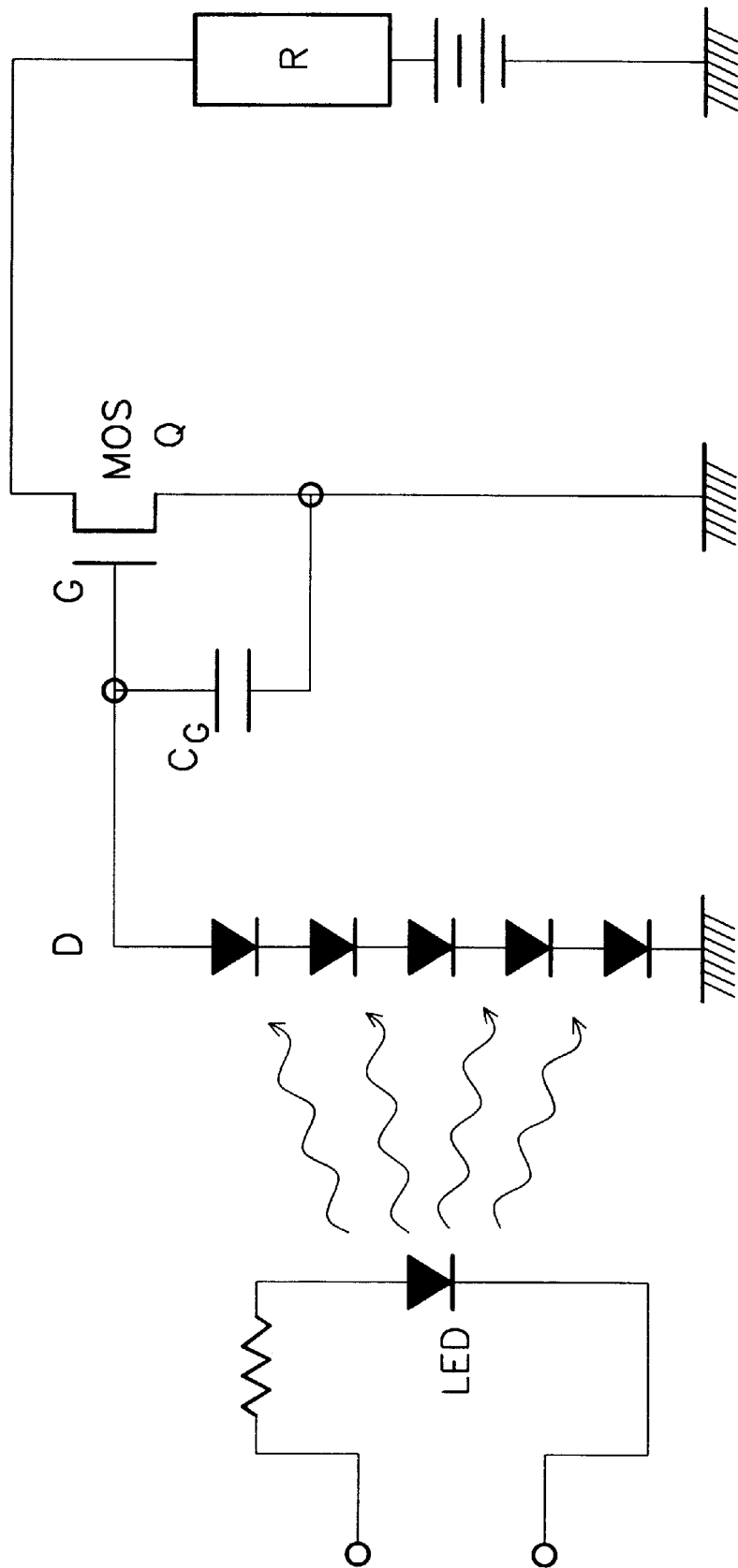
FIG. 1 is a schematic circuit of the solid-state switch driven by photovoltaic generator.
Figure 2:
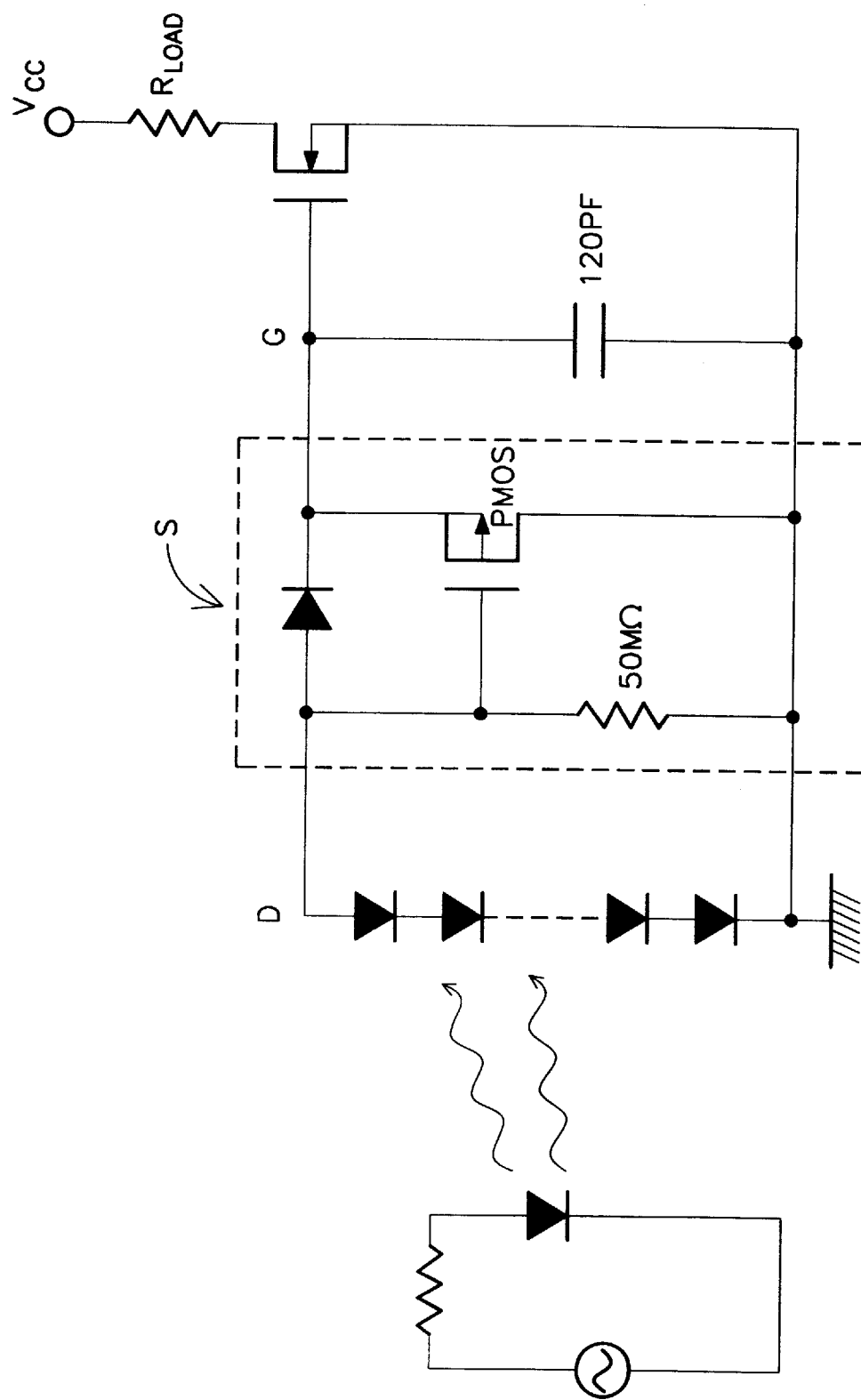
FIG. 2 exemplifies the turning-off leakage circuit used in the solid-state switch driven by photovoltaic generator shown in FIG. 1.
Figure 3A:
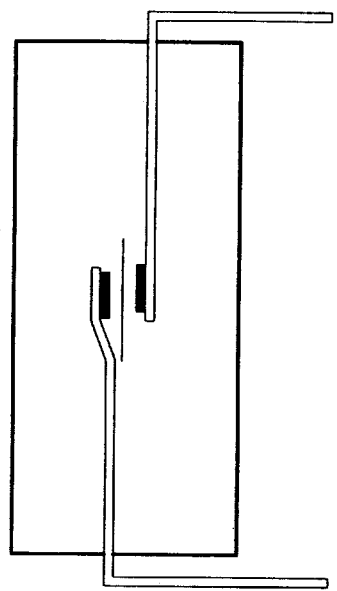
FIG. 3A shows the 3-dimensional package structure of the solid-state switch driven by photovoltaic generator.
Figure 3A:
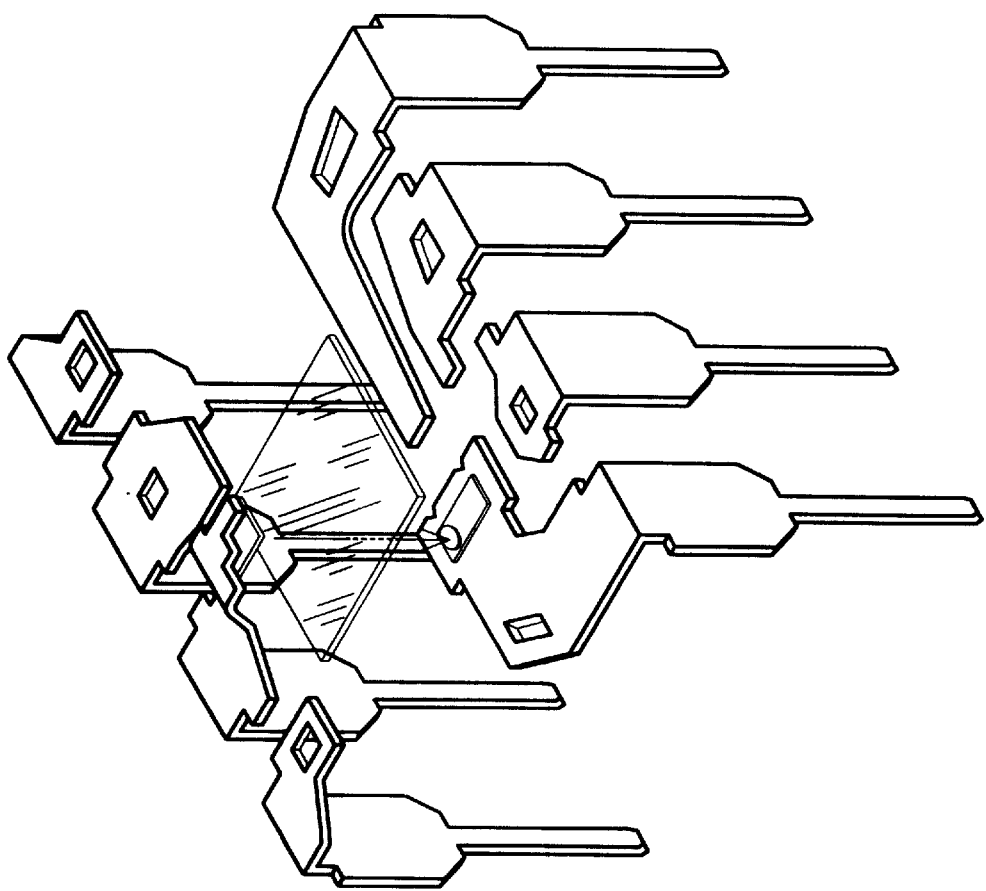
Figure 3B:
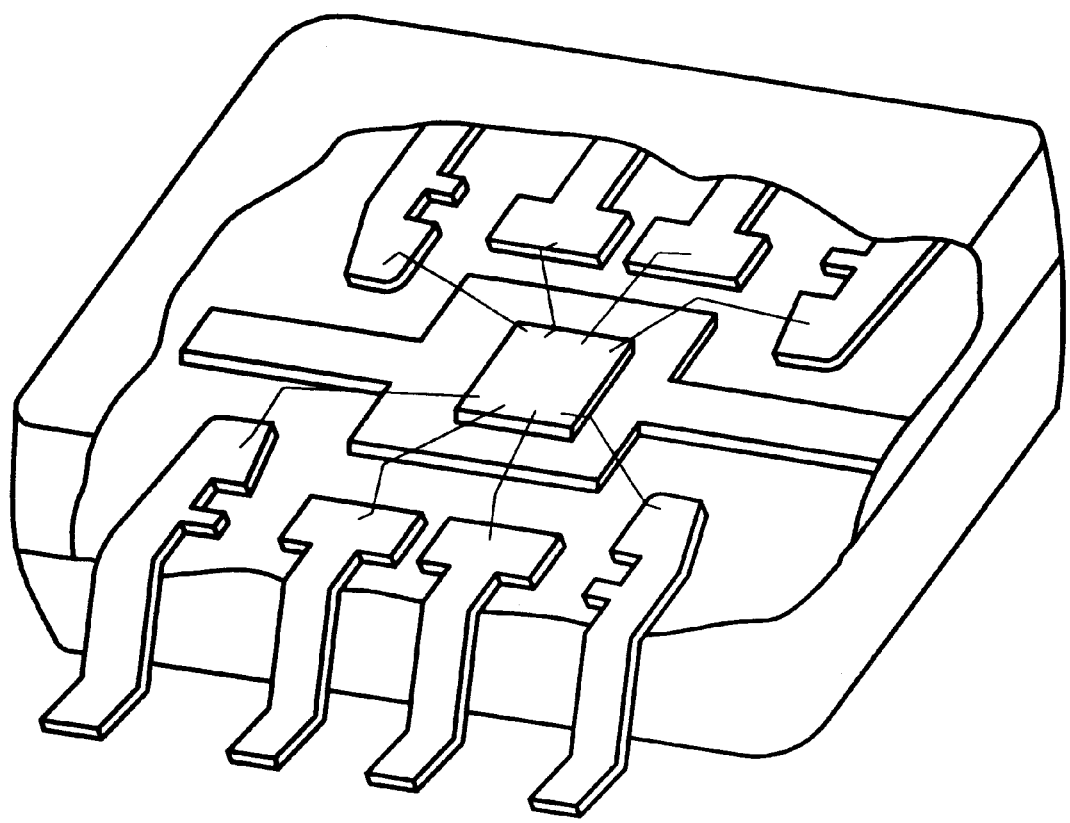
FIG. 3B shows the DIP planar package structure of the conventional IC.
Figure 4:
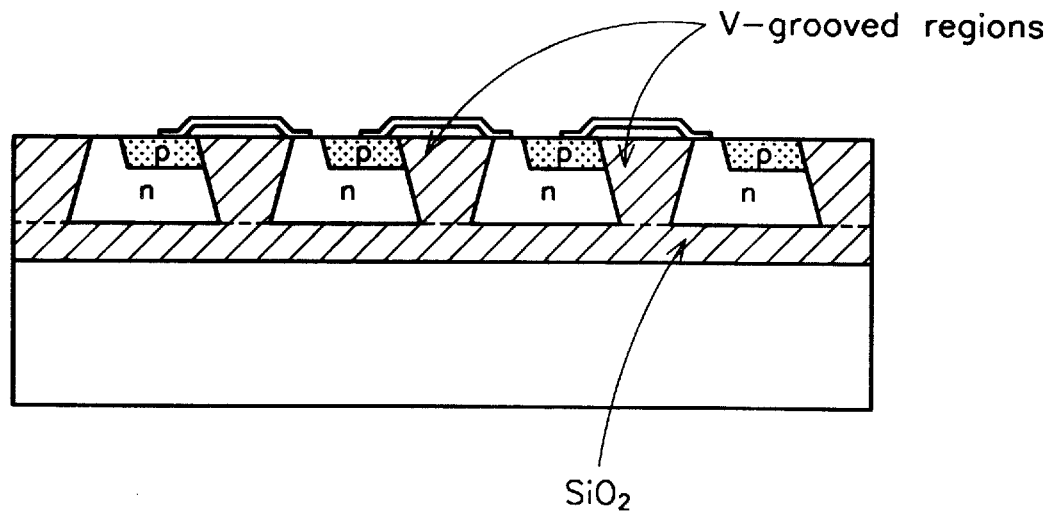
FIG. 4 shows the switch driven by photovoltaic generator, which is fabricated by the SOI chip.

In short, the solid-state switch driven by thermovoltaic generator in accordance with the present invention not only has the advantage that transimpedance is very high, like the solid-state switch driven by photovoltaic generator, but also has the advantages that chip area is smaller, manufacturing process is simpler, and package can be implemented with low-cost standard planar DIP (dual-in-line) structure (as shown in FIG. 3B) or the similar, since the driving and reacting elements are all formed on the same plane of silicon chip, namely, the monolithic.

As described in the above, to increase the sensitivity of the thermopile, it is necessary to provide a thermal pad with good heat isolation on a local region of the substrate, on which the hot junctions of the thermopile and the heating resistor are arranged. The thermal pad of the solid-state switch in accordance with the present invention mainly can be realized by the following two structures: one is suspended membrane structure; the other is non-suspended membrane structure. The first structure is implemented by forming a local suspended silicon membrane or glass membrane on the silicon substrate, on which the heating resistor and hot junctions are formed. Such structure has excellent thermal resistance characteristics, for instance, its thermal impedance can be up to $10^{4\circ}$ C./W under normal atmospheric pressure for the case of the aforementioned embodiment, which has chip area 5.4 mm². Furthermore, the thermal impedance can be up to $10^{5\circ}$ C./W if vacuum package is utilized to restrain heat conduction of ambient gas. The second structure is implemented by forming an oxide pad layer having good thermal isolation on the silicon substrate, which is immediately adjacent to the substrate. Although the second structure has smaller thermal resistance than that of the first structure, the thermal resistance is at least 100° C./W. As compared with the first structure, the second structure needs high compaction of element density, however, manufacturing and packaging are both easier.

Figure 6:
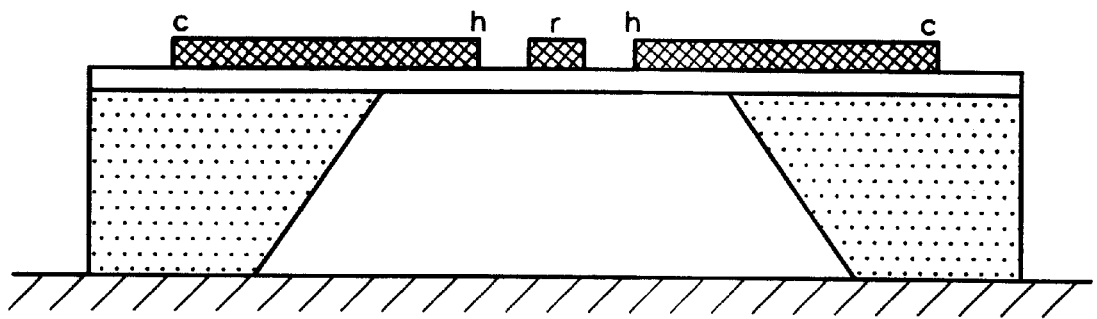
FIG. 6 illustrates the structure of a solid-state switch driven by thermovoltaic generator having suspended thermal pad.

There are various methods of forming the suspended membrane structure, one of them is shown in FIG. 6, which is implemented by removing the lower part of the silicon substrate using the technology of back-side anisotropic etching (lost-wafer process). Typically, the unremoved portion has the structure of heavily-boron-doped (>5×10¹⁹) silicon membrane with silicon dioxide insulating layer thereon or stress-free silicon nitride membrane, as described in the paper (A method of fabricating a thin, and low-stress dielectric film for microsensors applications, Proceeding of Eurosensors X, pp. 287~290, Sep. 8~11, 1996, Belgium by the present inventor et al.) and patent (Taiwanese Appln. No. 85109746) published by the assignee of the present invention. Furthermore, there are many micromachining technologies of forming suspended membrane, each of which makes the thermal pad required in the present invention easy to be pragmatized. These micromachining technologies are well known to those skilled in the art and thus the details are omitted here.

Figure 7:
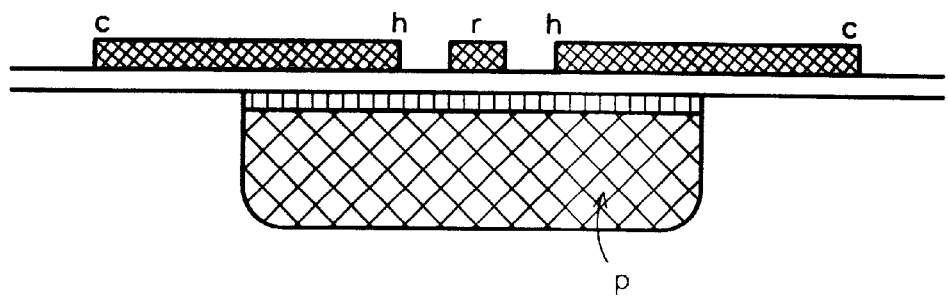
FIG. 7 illustrates the structure of a solid-state switch driven by thermovoltaic generator having non-suspended thermal pad.

FIG. 7 illustrates one example of the non-suspended thermal pad structure, in which a porous silicon layer (the region p in FIG. 7) having a thickness of tens of micrometers is formed on a silicon substrate using conventional electro-etching method. The porous silicon layer, which can be formed with commonly known semiconductor micro-machining technology—p-type semiconductor single crystal with concentration higher than $10^{16}/cm^3$ is subject to electro-etching in hydrofluoric acid solution, an earthworm-hall-like structure is thus formed on the superficial layer, has the characteristics of low heat conductivity and high oxidation speed, which are comparable to that of silicon dioxide. After the porous silicon layer is formed, a local and speedy oxidation is performed thereon to generate a glass layer of a couple of micrometers, such that a local thermal pad isolated thermally and electrically from the underneath porous silicon substrate is formed to provide the region T in FIG. 5A, on which the heating resistor and thermopile are formed.

Optionally, before the heating resistor and thermopile is formed on non-suspended thermal pad, polyimide, which is heat-proof, can be coated on the thermal pad with several micrometers by standard lithographic technique, then the heating resistor and the hot junctions of thermopile are formed on the polyimide layer. Since the thermal conductivity of polyimide is ⅕ that of pure silicon dioxide, and also 1/600 that of silicon, the thermal isolation effect is further enhanced and easier to manufacture. However, the subsequent process must be proceeded using low temperature chemical vapor deposition (LTCVD) technology with temperature kept under 400° C., which can be achieved with present technologies.

Figure 8A:
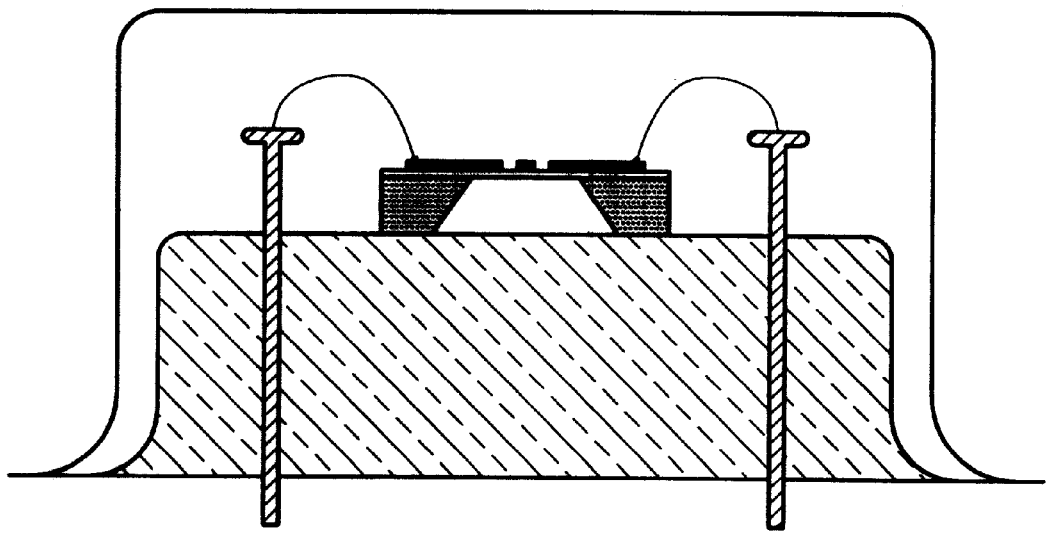
Figure 8B:
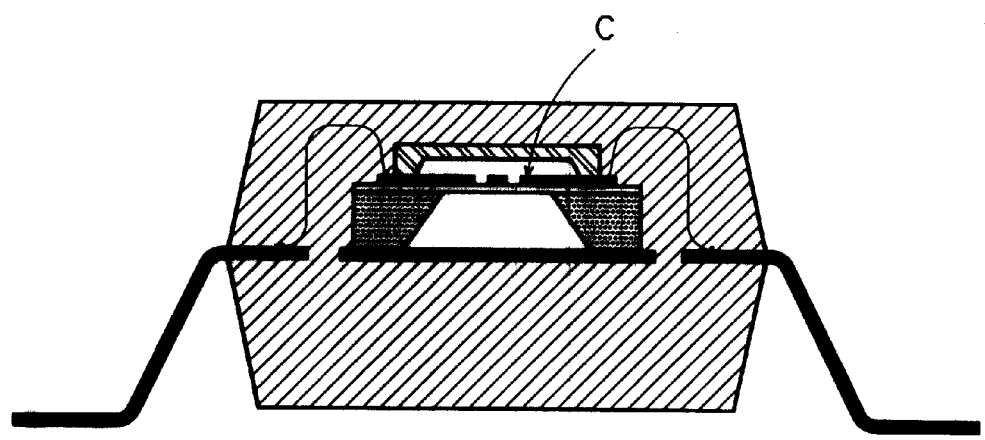
Figure 9:
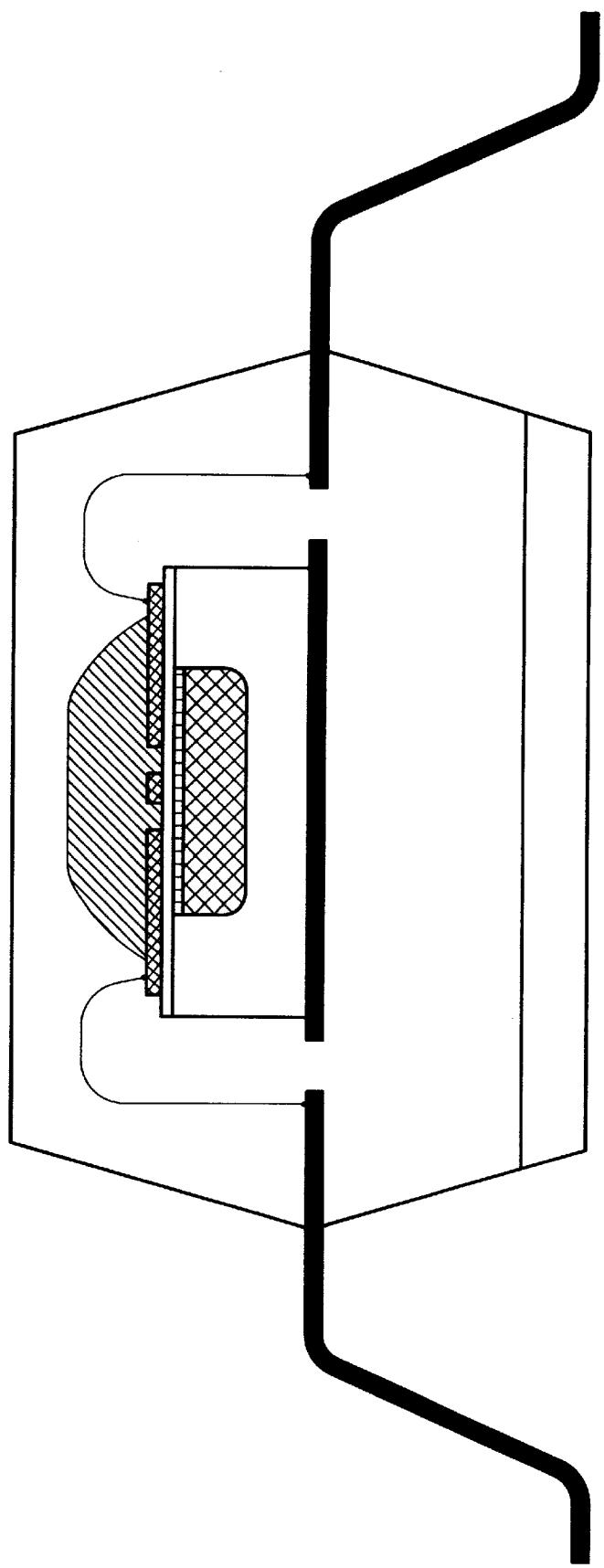
FIG. 9 shows the package of a solid-state switch driven by thermovoltaic generator having non-suspended thermal pad.

FIGS. 8A and 8B illustrate two packaging methods for the suspended thermal pad structure, wherein FIG. 8A illustrates the resulting structure using standard TO metal-can packaging technology; FIG. 8B illustrates the resulting structure using standard DIP (dual-in-line) packaging technology. If the structure shown in FIG. 8A uses vacuum package ($<10^{-2}$ Torr) to reduce heat loss of gas, then even higher heat efficiency can be achieved, with reference to the paper: High performance Pirani vacuum gauge, Journal of Vacuum Science & Technology A, vol. 13, No. 6, December 1995, published by the assignee of the present invention. For the structure shown in FIG. 8B, to reduce the heat conduction due to the upper edge of the element contacting the package material, wafer bonding technology is applied at the element itself such that a sealed cavity is fabricated beforehand such that the suspended membrane can be insulated from glue but does not contact it, as shown in C of FIG. 8B. Although the method is more complicated, it has the advantage that vacuum sealed cavity structure can be accomplished with wafer bonding technology, which leads to high thermal resistance characteristic since there is no heat loss of gas. Furthermore, FIG. 9 shows the package of a solid-state switch having non-suspended thermal pad. The structure is different from conventional DIP package in that, after the steps of die bonding and wire bonding and before the step of injection mold of epoxy, dies are covered with a thick layer of silicone rubber, which has excellent thermal isolation, to refrain heat dissipation on the thermal pad. The thermal conductivity of silicone rubber used in electronic applications is very small, about 1/2400 that of silicon chip, and also about 1/10 that of injection molded epoxy in IC package. The low thermal conductivity prevents the thermopile from heat dissipation of the hot junctions while the thermopile is actuated. Consequently there is a sufficient temperature difference between the cold and hot junctions. The aforementioned methods all can be implemented with standard IC packaging technologies, easy to achieve automatic mass-production and low cost. As compared to the package structure for the solid-state switch driven by photovoltaic generator shown in FIG. 3A, the package structure is much simpler, which is another advantage of the solid-state switch in accordance with the present invention.

In summary, the monolithic solid-state element driven by thermovoltaic generator, which drives MOS switching device, in accordance with the present invention not only has high transimpedance as the conventional mechanical or photovoltaic generator switch, but also has the advantage that the manufacturing process can be implemented with standard microelectronic process. Therefore, it is adapted for batch production, the required chip area for the element is small, the package can be implemented with standard DIP or TO metal-can structure, cost can be greatly reduced. Furthermore, the controlling electric power at the input end is smaller than that of conventional element, and the resistance of the heating resistor can be designed to adapt to various input currents or voltages. In conclusion, the solid-state switch in accordance with the present invention has quite creative and pragmatic value.

While the invention has been particularly shown and described with reference to the preferred embodiments thereof, it will be understood by those skilled in the art that various changes in form and details may be made without departing from the spirit and scope of the invention.

What is claimed:

1. A solid-state switch driven by thermovoltaic generator, comprising:

a silicon substrate;

a MOSFET with gate receiving a signal such that output load can be controlled;

a thermal pad disposed on a local region of said silicon substrate by micromachining technology for thermal isolation;

a thin-film heating resistor disposed on said thermal pad, which is the input end of the switch; and a thermopile consisting of a plurality of p-n junction semiconductor thin-film thermocouples in series connection, the hot junctions of said thermocouples being disposed on said thermal pad and contiguous to said thin-film heating resistor with sufficient dielectric strength between them, the cold junctions of said thermocouples, with temperature being the same as that of said substrate, being disposed on the substrate region far from said thermal pad, the output end of said thermopile being used as the input end of said MOSFET;

as an input voltage being applied to said thin-film heating resistor, Joule's heat being generated at said heating resistor, a proper temperature difference thus appearing between the hot junctions and the cold junctions of said thermopile due to non-uniform heat distribution, which induces a thermoelectric potential at the output of said thermopile for turning on said MOSFET; as said input voltage being removed, the temperatures of the hot and cold junctions becoming the same owing to thermal equilibrium, the thermoelectric potential appearing at said output end of said thermopile becoming zero, which turning off said MOSFET.

2. The solid-state switch of claim 1, wherein said heating resistor and said thermopile are fabricated as a single chip element by employing standard microelectronic process, and there are complete electric isolation and very high transimpedance between said heating resistor and said thermopile, thereby a small power can be applied at the input end to control the high voltage and high power at the output end of said MOSFET.

3. The solid-state switch of claim 1, wherein each thermocouple of said thermopile is a polysilicon p-n junction having excellent Seebeck effect, microelectronic process is utilized to form said plurality of series-connected thermocouples on said silicon substrate such that said thermopile can generate a potential which turns on said MOSFET.

4. The solid-state switch of claim 1, wherein each thermocouple of said thermopile is composed of conventional semimetals, Te and Bi, microelectronic process is utilized to form said plurality of series-connected thermocouples on said silicon substrate such that said thermopile can generate a potential which turns on said MOSFET.

5. The solid-state switch of claim 1, wherein said thermal pad, formed by using various known micromachining technologies, is a suspended membrane composed of silicon or silicon nitride on said silicon substrate with excellent thermal isolation, said heating resistor and said hot junctions of said thermopile are formed on said suspended membrane, said cold junctions are formed on non-suspended portion of said silicon substrate.

6. The solid-state switch of claim 1, wherein said thermal pad is formed by first fabricating a porous silicon structure having thickness of tens of micrometers on a local region of said silicon substrate, then applying local oxidation to said region such that a silicon dioxide having thickness of a couple of micrometers is formed on the surface of said porous silicon, a non-suspended membrane is thus formed which has excellent electrical and thermal isolation between said heating resistor and said porous silicon, said thermopile and said porous silicon.

7. The solid-state switch of claim 1, wherein a package is implemented by using conventional TO metal-can to perform die-bonding and wire-bonding.

8. The solid-state switch of claim 1, wherein the package is implemented by performing standard die-bonding and wire-bonding on standard IC lead frame, covering said switch with a thick silicone layer having excellent thermal isolation, then fabricating an IC module by standard dual-in-line epoxy package, such that batch production of low cost is attained.

9. The solid-state switch of claim 7, wherein a inner cavity of said TO metal-can package structure is vacuumized to reach the state of approximately $10^{-3}$ torr or lower air pressure while being sealed, thereby heat loss of gas is reduced, which increases the temperature difference between said cold and hot junctions, therefore the actuating efficiency.

10. The solid-state switch of claim 1, wherein said thin-film heating resistor, said thermal pad, said thermopile, and said MOSFET, are all integrated on a silicon chip such that a monolithic integrated element is formed.

11. The solid-state switch of claim 1, wherein said thin-film heating resistor, said thermal pad and said thermopile are integrated on a silicon chip, said MOSFET is formed on another silicon chip, such that the two silicon chips are packaged in the form of dual-die module.

12. The solid-state switch of claim 1, wherein the device chip is implemented by forming a vacuum micro-cavity using wafer-bonding technology before the chip package.

13. The solid-state switch of claim 12, wherein said vacuum micro-cavity structure is attained by using vacuum wafer-bonding technology, such that heat loss of gas is reduced and the temperature difference between said hot and cold junctions of said thermopile is increased to improve the switching efficiency.

14. The solid-state switch of claim 1, wherein the input signal to said heating resistor can be DC or AC, high voltage or low voltage, which depends on appropriate value of said heating resistor.

* * * * *